United States Patent
Chu-Kung et al.

(10) Patent No.: US 9,698,222 B2
(45) Date of Patent: Jul. 4, 2017

(54) METHOD OF FABRICATING SEMICONDUCTOR STRUCTURES ON DISSIMILAR SUBSTRATES

(71) Applicant: Intel Corporation, Santa Clara, CA (US)

(72) Inventors: Benjamin Chu-Kung, Portland, OR (US); Sherry R. Taft, Sherwood, OR (US); Van H. Le, Portland, OR (US); Sansaptak Dasgupta, Hillsboro, OR (US); Seung Hoon Hoon Sung, Potland, OR (US); Sanaz K. Gardner, Portland, OR (US); Matthew V. Metz, Portland, OR (US); Marko Radosavljevic, Beaverton, OR (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/036,406

(22) PCT Filed: Dec. 23, 2013

(86) PCT No.: PCT/US2013/077622
§ 371 (c)(1),
(2) Date: May 12, 2016

(87) PCT Pub. No.: WO2015/099689
PCT Pub. Date: Jul. 2, 2015

(65) Prior Publication Data
US 2016/0276438 A1    Sep. 22, 2016

(51) Int. Cl.
*H01L 29/10* (2006.01)
*H01L 29/66* (2006.01)
(Continued)

(52) U.S. Cl.
CPC ...... *H01L 29/1037* (2013.01); *H01L 29/0649* (2013.01); *H01L 29/161* (2013.01); *H01L 29/2003* (2013.01); *H01L 29/66795* (2013.01)

(58) Field of Classification Search
CPC ............. H01L 29/1037; H01L 29/2003; H01L 29/0649; H01L 29/161; H01L 29/785;
(Continued)

(56) References Cited

U.S. PATENT DOCUMENTS 6,514,809 B1 * 2/2003 Xiang ............... H01L 29/66772
257/E21.415
7,067,837 B2   6/2006 Hwang et al.
(Continued)

FOREIGN PATENT DOCUMENTS

KR    10-2004-0085902 A    10/2004

OTHER PUBLICATIONS

Notification of Transmittal of the International Preliminary Report on Patentability of the International Searching Authority for PCT/US2013/077622 filed Dec. 23, 2013 mailing date Jul. 7, 2016, 9 pages.
(Continued)

*Primary Examiner* — David Vu
*Assistant Examiner* — Mouloucoulaye Inoussa
(74) *Attorney, Agent, or Firm* — Blakely, Sokoloff, Taylor & Zafman LLP (57) ABSTRACT

Techniques are disclosed for forming a defect-free semiconductor structure on a dissimilar substrate with a multi-aspect ratio mask. The multi-aspect ratio mask comprises a first, second, and third layer formed on a substrate. The second layer has a second opening wider than a first opening and a third opening in the first and third layers, respectively. All three openings are centered along a common central axis. A semiconductor material is grown from the top surface of the
(Continued)

substrate and laterally onto the top surface of the first layer within the second opening. The semiconductor material disposed within and vertically below the third opening is etched by using the third layer as an etch mask so that the remaining material that laterally overflowed onto the top surface of the first layer forms a remaining structure.

17 Claims, 7 Drawing Sheets

(51) Int. Cl.
*H01L 29/06* (2006.01)
*H01L 29/161* (2006.01)
*H01L 29/20* (2006.01)

(58) Field of Classification Search
CPC .......... H01L 29/66795; H01L 27/2436; H01L 45/06; H01L 45/1683; H01L 45/1273; H01L 45/144
USPC .......... 257/296, 298, 300, 3, 4, 42; 438/429, 438/254
See application file for complete search history.

(56) References Cited

U.S. PATENT DOCUMENTS

| | | | |
|---|---|---|---|
| 2003/0052351 A1* | 3/2003 | Xu | .......................... H01L 45/06 257/296 |
| 2003/0073295 A1 | 4/2003 | Xu | |
| 2008/0012000 A1 | 1/2008 | Harshfield | |
| 2008/0096375 A1 | 4/2008 | Chen | |
| 2008/0138929 A1 | 6/2008 | Lung | |
| 2016/0204036 A1* | 7/2016 | Goel | ................. H01L 29/66795 438/429 |

OTHER PUBLICATIONS

Office Action including Search Report (7 pages) dated Aug. 29, 2016 from the Examiner of the Intellectual Property Office (the IPO) for Taiwan Patent Application No. 103140480 and English Translation (8 pages) thereof.
Notification of Transmittal of the International Search Report and the Written Opinion of the International Searching Authority for PCT/US2013/077622 filed Dec. 23, 2013 mailing date Sep. 18, 2014, 12 pages.
Notice of Allowance (4 pages) dated Jan. 25, 2017 from the Taiwan Intellectual Property Office for Taiwan Patent Application No. 103140480.

* cited by examiner

METHOD OF FABRICATING SEMICONDUCTOR STRUCTURES ON DISSIMILAR SUBSTRATES

This patent application is a U.S. National Phase Application under 35 U.S.C. 371 of International Application No. PCT/US2013/077622 filed Dec. 23, 2013

TECHNICAL FIELD

Embodiments of the present invention relate generally to methods of fabricating semiconductor structures on dissimilar substrates. More particularly, embodiments of the present invention relate to methods of fabricating gallium nitride structures on dielectric layers.

BACKGROUND

Gallium nitride (GaN) is a wide band gap semiconductor material that has been widely explored for its beneficial properties relating to micro-electronic devices including, but not limited to, transistors, light emitting diodes (LED), and high-power transistor devices. Currently, GaN is grown directly on non-native substrates such as silicon substrates. Substantial lattice mismatch occurs when GaN is grown on non-native substrates. Lattice mismatch causes threading dislocation defects to propagate within the epitaxially grown GaN material. Currently, conventional solutions grow high quality GaN layers by lateral epitaxial overgrowth (LEO) where high quality GaN is grown laterally (<100> direction) over a non-GaN substrate from an adjacent trench.

DETAILED DESCRIPTION

A method to fabricate a semiconductor structure on a dissimilar substrate is described. Embodiments of the present invention have been described with respect to specific details in order to provide a thorough understanding of the invention. One of ordinary skill in the art will appreciate that the invention can be practiced without these specific details. In other instances, well known semiconductor processes and equipment have not been described in specific detail in order to not unnecessarily obscure embodiments of the present invention. Additionally, the various embodiments shown in the figures are illustrative representations and are not necessarily drawn to scale.

Embodiments of the present invention are directed to fabricating semiconductor structures on dissimilar substrates. In an embodiment, a mask is initially formed on a semiconductor substrate. The mask can be a multi-layered mask consisting of three vertically stacked dielectric layers. An initial opening is then formed through all three layers. Each layer has an opening and all three openings are aligned to one another so that the semiconductor substrate is exposed. Next, the second opening is laterally extended so that the second opening is wider than the first and the third openings. Afterwards, a semiconductor material is epitaxially grown from a top surface of the substrate. When the semiconductor material grows above the first layer, it begins to grow laterally into the wider second opening by LEO. Next, a defective portion of the epitaxially grown semiconductor material is etched away by using the third layer as a self-aligned etching mask. A portion of the epitaxially grown semiconductor material that is substantially free of defects subsequently remains on the first layer of the multi-layered mask. The remaining defect-free semiconductor material forms a semiconductor structure that is dissimilar to the substrate upon which it is formed.

FIGS. 1A-1L illustrate cross-sectional, top-down, and isometric views of a method for forming a semiconductor structure on a dissimilar substrate in accordance with embodiments of the invention.

Figure 1A:
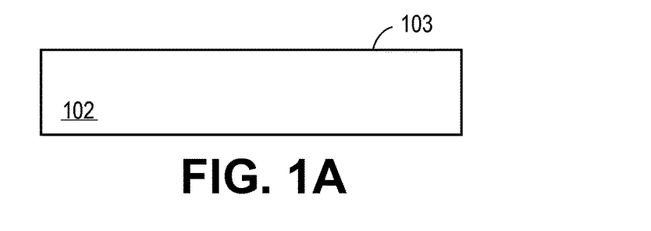
FIGS. 1A-1L illustrate cross-sectional, top-down, and isometric views of a method for forming a semiconductor structure on a dissimilar substrate, in accordance with an embodiment of the invention.

In FIG. 1A, the method begins by providing a substrate 102 with a top surface 103. The substrate can be any suitable structure, such as a monocrystalline substrate or a silicon-on-insulator (SOI) substrate. Furthermore, the substrate can be composed of any suitable material such as, but not limited to, silicon (Si), sapphire ($Al_2O_3$), silicon carbide (SiC), gallium arsenide (GaAs), and gallium phosphide (GaP). In one embodiment, the substrate is a global <100> oriented monocrystalline silicon substrate.

Figure 1B:
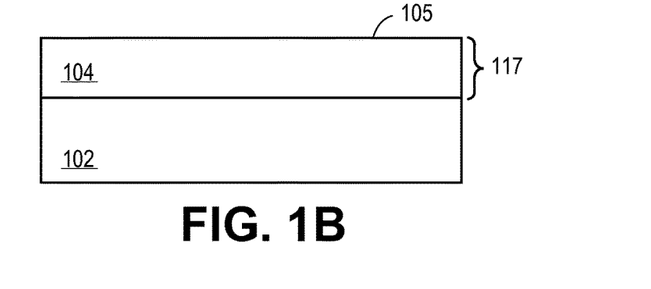

As shown in FIG. 1B, a first layer 104 is then disposed on the top surface 103 of the substrate 102. The first layer 104 has a thickness 117 and a top surface 105. The first layer 104 may be composed of any suitable dielectric or insulating material such as, but not limited to, silicon nitride ($Si_3N_4$), silicon dioxide ($SiO_2$), carbon-doped oxide, or a low-k dielectric material. In one embodiment, the first layer 104 is a dielectric layer composed of $SiO_2$. Additionally, the first layer 104 may be composed of any suitable metal such as, but not limited to, titanium-nitride, tungsten, or tantalum nitride. The first layer 104 can be used as an aspect ratio trapping (ART) layer to trap defects during epitaxial growth of semiconductor materials. Thus, the first layer 104 can have a thickness 117 that traps a desired amount of defects. In one embodiment, the thickness 117 of the first layer 104 is less than 2000 Å. In one particular embodiment, the thickness 117 of the first layer 104 ranges from 200 Å to 2000 Å.

Figure 1C:
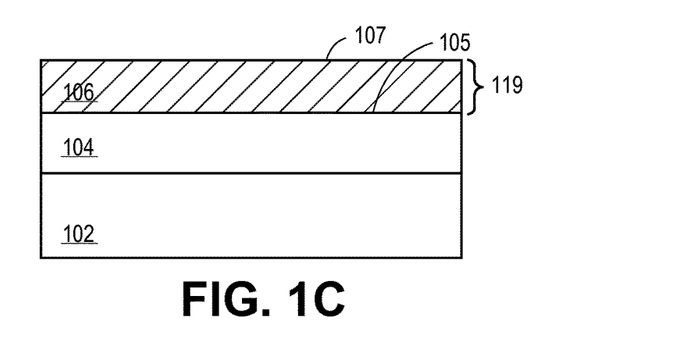

Next, as depicted in FIG. 1C, a second layer 106 is formed on the top surface 105 of the first layer 104. The second layer 106 has a thickness 119 and a top surface 107. The second layer 106 may be composed of any suitable dielectric or insulating material such as, but not limited to, $Si_3N_4$, $SiO_2$, carbon-doped oxide, or a low-k dielectric material. Additionally, the second layer 106 may be composed of any suitable metal such as, but not limited to, titanium-nitride, tungsten, or tantalum nitride. The material of the second layer 106 is different from the material of the first layer 104 so that the second layer 106 may be etched selective to the first layer 104. That is, the second layer 106 is etched and the first layer 104 is not substantially etched. For instance, the etch rate for the second layer 106 is substantially higher than the etch rate for the first layer 104, such as a selectivity ratio of 5:1 in one embodiment, or 10:1 in an alternative embodiment. In one embodiment, the first layer is a $SiO_2$ layer and the second layer is a $Si_3N_4$ layer. The second layer can be widened to allow LEO of a semiconductor material to be disposed on the first layer 104.

Figure 1D:
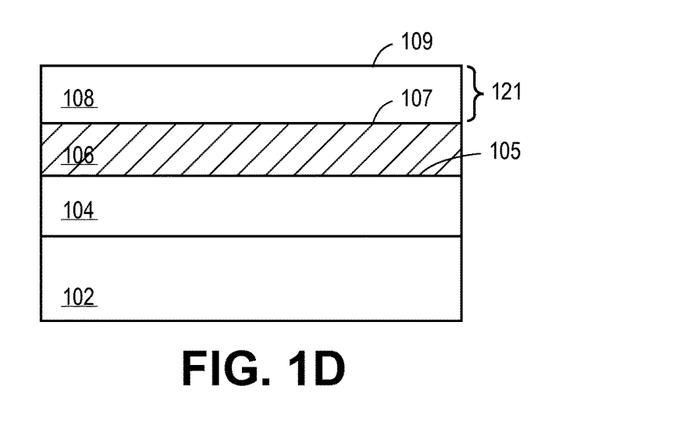

Subsequently, as shown in FIG. 1D, a third layer 108 is formed on the second layer 106. The third layer 108 has a thickness 121 and a top surface 109. The third layer 108 may be composed of any suitable dielectric or insulating material such as, but not limited to, $Si_3N_4$, $SiO_2$, carbon-doped oxide, or a low-k dielectric material. Furthermore, the third layer 108 may be composed of any suitable metal such as, but not limited to, titanium-nitride, tungsten, or tantalum nitride. In an embodiment, the material of the third layer 108 is different from the material of the second layer 106 so that the second layer 106 may be etched selective to the third layer 108. Additionally, the third layer 108 may be composed of the same material as the first layer 104. In one embodiment, the first and third layers are $SiO_2$ layers and the second layer is a $Si_3N_4$ layer. In another embodiment, all three layers are composed of different materials such that any one layer can be etched selective to any other layer. The third layer 108 can be used as a self-aligned mask layer to remove defective semiconductor material within the first and second layers. Thus, the thickness 121 of the third layer 108 can be any suitable thickness to etch the desired amount of material within the first and second layers 104 and 106. Generally, the thickness 121 of the third layer 108 is larger than the thickness 117 of the first layer 104 and the thickness 119 of the second layer 106. In some embodiments, the thickness 121 is larger than the thicknesses 117 and 119 combined. In one embodiment, the thickness 121 of the third layer 108 is less than 1 μm. In one particular embodiment, the thickness 121 of the third layer 108 ranges from 200 Å to 1 μm.

The first, second, and third layers may be formed by any suitable blanket deposition technique such as, but not limited to, chemical vapor deposition (CVD) and plasma vapor deposition (PVD). Additionally, a chemical-mechanical polishing (CMP) process can be used to planarize one or any of the top surface of the dielectric material, thereby forming a uniform, flat layer if desired.

Figure 1E:
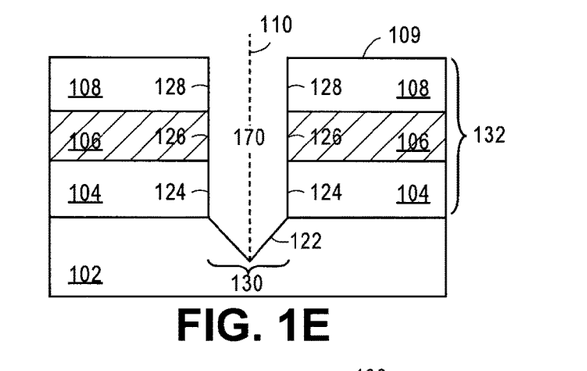
Figure 1E:
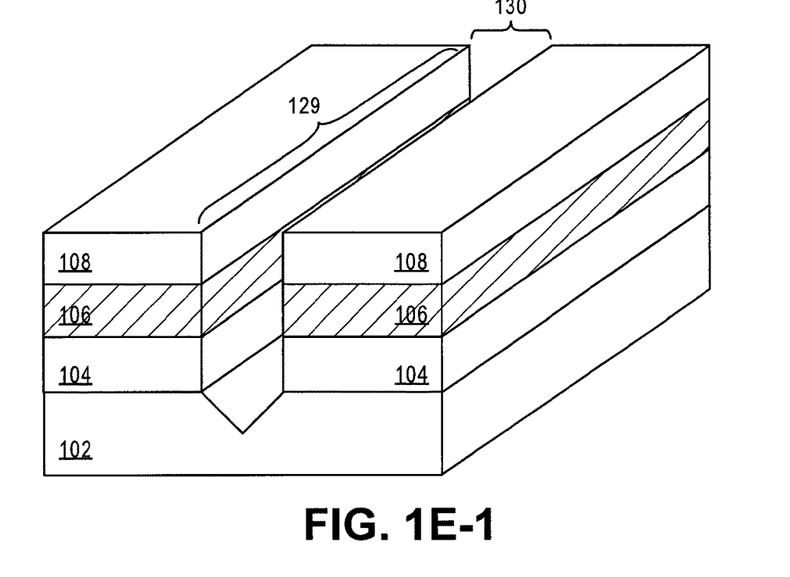

With reference to FIG. 1E, after formation of the third layer 108, a first etch process forms an initial opening 170 through all three layers. The initial opening 170 has a common central axis 110 that represents the center of the opening. The first etch process creates the initial opening 170 with vertically aligned sidewalls 124, 126, and 128 within the first, second, and third layers. The initial opening 170 extends a depth 132 from the top surface 109 of the third layer 108 to the top surface 122 of the substrate 102 in order to expose the top surface 122 of the substrate 102. In one embodiment, the depth 132 ranges from 600 Å to 2 μm. Moreover, the initial opening 170 may also have a width 130 and a length 129 as depicted in FIG. 1E-1. The length 129 may be significantly longer than the width 130 to form a trench. In some embodiments, the initial opening is a trench that has a width to length ratio that ranges from 1:1 to 1:20.

The initial opening may be formed by any suitable anisotropic dry etch process typically used to form vertical openings in a multi-layer dielectric mask. In one embodiment, the initial opening is formed by an anisotropic dry etch process using a $Cl_2$-based reactant gas. In another embodiment, the initial opening is formed by an anisotropic dry etch process using a fluorine-based reactant gas.

As also depicted in FIG. 1E, the top surface 122 of the substrate 102 can be further etched to have a modified surface. In one embodiment, the top surface 122 is further etched to have a V-groove profile. The V-groove profile has modified top surfaces 122 that expose the <111> plane within a global <100> silicon substrate and converge at a lowest point. One advantage of a V-groove profile is that it allows better lattice matching between the epitaxially grown material and non-native substrate. In another embodiment, the top surface 122 is a deep V-groove profile, which is not shown in FIG. 1E. A deep V-groove profile is a V-groove profile formed at a bottom of a trench formed within the silicon substrate. The substrate has vertical sidewalls extending up from the edges of the modified top surfaces 122 to the first layer 104.

The modified top surfaces 122 may be formed by any typical crystallographic etch process. In one embodiment, the modified top surfaces 122 are formed by a wet etch process. By way of example, not by way of limitation, a silicon substrate may be etched with an active solution such as, but not limited to, potassium hydroxide (KOH) or tetramethyl ammonium hydroxide (TMAH). The deep V-groove profile may be formed by any typical anisotropic dry etch process followed by any typical crystallographic etch process. In one embodiment, the deep V-groove profile is formed by an anisotropic dry etch process using a $Cl_2$-based reactant gas followed by a wet etch process with an active solution comprising KOH.

Figure 1F:
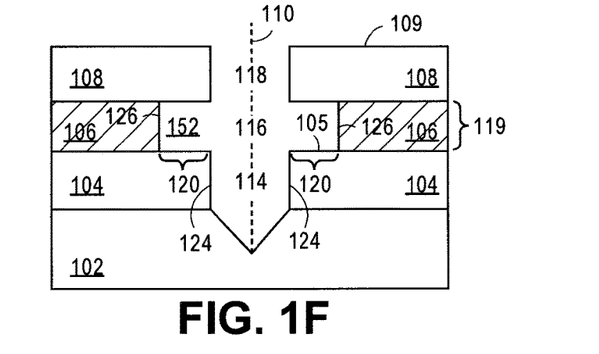

Next, as shown in FIG. 1F, a lateral extension 120 is formed in a second opening 116. The lateral extension 120 makes the second opening 116 of the second layer 106 wider than a first opening 114 of the first layer 104 and a third opening 118 of the third layer 108. The wider second opening 116 forms a blown-out region 152 within the second layer 106. Consequently, a multi-aspect ratio mask is formed. The blown-out region 152 allows a semiconductor structure to be subsequently disposed on the top surface 105 of the first layer 104. As will be appreciated in light of this disclosure, the distance of the lateral extension 120 may depend on the dimensions of the semiconductor structure sought to be disposed within the blown-out region 152.

An isotropic second etch process may form the lateral extension 120 by etching the second layer 106 selective to the first and third layers 104 and 108. For instance, if the second layer is $Si_3N_4$ and the first and third layers are $SiO_2$, the $Si_3N_4$ layer can be wet etched with hot phosphoric acid ($H_3PO_4$). A selectivity of greater than 80:1 can be observed with an $H_3PO_4$ wet etchant solution at a process temperature of 160-165° C. Instead of $H_3PO_4$, a selective dry etch may be used, such as carbon tetrafluoride ($CF_4$) and $O_2$. A selectivity of around 40:1 can be observed with $CF_4$ as an etchant gas with an $O_2$ flow of around 30 sccm. The $Si_3N_4$ layer can also be selectively etched with nitrogen trifluoride ($NF_3$) and $O_2$ instead of $CF_4$ and $O_2$. A selectivity of 100:1 can be observed with $NF_3$ as an etchant gas with an $O_2$ flow of around 45 sccm. These process gasses primarily remove the $Si_3N_4$ material while leaving the $SiO_2$ material substantially intact.

Other suitable process flows, not including the one just mentioned in FIGS. 1E-1F, can be used to form the three openings in the multi-aspect ratio mask according to an embodiment of the invention. For example, an initial anisotropic etch process may be used to form an opening in the third layer. Following this initial etch, a selective isotropic etch may be used to laterally extend the second opening while leaving the first and third layers substantially intact. Subsequently, another anisotropic etch may be used to form an opening in the first layer, exposing a top surface of the substrate. Thereafter, an optional crystallographic etch may be used to modify the top surface of the semiconductor substrate. At any rate, any method of forming a multi-aspect ratio mask with a wider middle opening may be a suitable method envisioned in an embodiment of the invention.

Figure 1G:
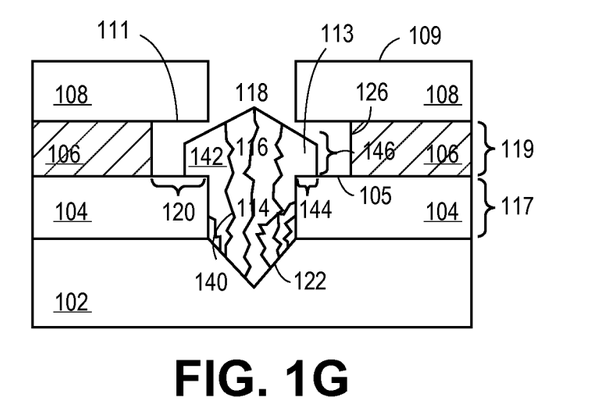

Shown in FIG. 1G, after etching the second layer 106 selective to a first and third layers 104 and 108, a semiconductor material 142 is epitaxially grown on the top surface 122 of the semiconductor substrate 102. In an embodiment, the semiconductor material 142 epitaxially grown on surface 122 is composed of a wide band gap material (e.g., any material with a band gap greater than 2.0 eV), a III-V material, germanium, silicon, or any material that suffers from dislocations and stacking faults in its crystal structure during epitaxial growth on a non-native substrate. In one particular embodiment, the semiconductor material 142 is GaN. In a specific embodiment, the semiconductor material 142 is GaN and the semiconductor substrate 102 is silicon. In an alternative embodiment, the semiconductor material 142 is composed of silicon germanium (SiGe).

Semiconductor material 142 initially epitaxially grows within the confined boundaries of the first opening 114. Because of first sidewall 124, semiconductor material 142 cannot grow laterally. Thus, semiconductor material 142 grows substantially vertically within the first opening 114. Threading dislocation defects 140 may form in the semiconductor material 142 during epitaxial growth. These defects may be caused by a lattice mismatch between the semiconductor material 142 and the non-native substrate 102. A non-native substrate can be any substrate that has a mismatching lattice structure and/or a mismatching lattice constant with the semiconductor material epitaxially grown on top of it. Threading dislocation defects 140 originate from the top surface 122 of the semiconductor substrate 102 and propagate through the semiconductor material 142. Horizontally and diagonally propagating threading dislocation defects terminate against the first sidewall 124 of the first layer 104. As such, very few horizontally and diagonally propagating threading dislocation defects continue to propagate above the first layer 104. Rather, only vertically propagating defects continue to propagate above the first layer 104. Accordingly, the thickness 117 of the first layer 104 directly affects the amount of horizontally and diagonally propagating threading dislocation defects 140 that propagate above the first layer 104. For instance, a larger first layer thickness 117 provides a larger first sidewall 124 to trap dislocation defects, thereby significantly decreasing the amount of horizontal and diagonal defects that may propagate above the first layer 104. In one embodiment, the first layer 104 is formed to a sufficient thickness 117 for trapping defects. In an embodiment, the thickness 117 of the first layer 104 is less than 2000 Å. In a particular embodiment, the thickness 117 of the first layer 104 ranges from 200 Å to 2000 Å.

As the semiconductor material 142 grows above the first layer 104, the semiconductor material 142 grows laterally into the blown-out region 152 of the second layer 106. The semiconductor material 142 laterally extends a distance 144 into the blown-out region 152. The semiconductor material that laterally grows into the blown-out region 152 may have very little threading dislocation defects 140 because most of the defects 140 that propagate horizontally and diagonally have already terminated into the first sidewall 124 of the first layer 104. Furthermore, the vertically propagating defects would not propagate laterally into the blown-out region 152. Therefore, the semiconductor material that laterally grows into the blown-out region 152 is substantially high-quality material that is significantly free of defects ("defect-free").

Accordingly, a defect-free semiconductor material 113 is formed within the blown-out region 152 of the multi-aspect ratio mask. In one embodiment, the dimensions of the blown-out region 152 contain an extended region 120 and a thickness 119 that do not limit the defect-free semiconductor material 113 growth. The defect-free semiconductor material 113 may grow laterally within the blown-out region until the end of a process time. Accordingly, the lateral growth may stop before the defect-free semiconductor material 113 reaches the second sidewall 126. As such, the defect-free semiconductor material 113 may not coalesce with the second sidewall 126. In addition, the defect-free semiconductor material 113 may also grow vertically until the end of the process time. Accordingly, the vertical growth may stop before the defect-free semiconductor material 113 reaches a bottom surface 111 of the third layer 108. As such, the defect-free semiconductor material 113 may not coalesce with the bottom surface 111 of the third layer 108.

In an alternative embodiment, the extended region 120 is designed to limit the lateral growth of defect-free semiconductor material 113. For instance, a self-limiting process may grow the defect-free semiconductor material 113 within the blown-out region 152. The self-limiting process may grow the defect-free semiconductor material 113 so that it coalesces with the second sidewall 126. Thereafter, the lateral growth is stopped regardless of whether process gas continues to flow. As a result, the width of the extended region 120 may determine the exact width 144 of the defect-free semiconductor material 113.

In yet another alternative embodiment, the thickness 119 is designed to limit the vertical growth of defect-free semiconductor material 113. For example, a self-limiting process may grow the defect-free semiconductor material 113 so that it coalesces with the bottom surface 111 of the third layer 108. Thereafter, the vertical growth is stopped regardless of whether process gas continues to flow. As such, the thickness 119 of the second layer 106 may determine the exact height 146 of the defect-free semiconductor material 113. Furthermore, the thickness 119 can also be designed to limit the lateral growth of the defect-free semiconductor material 113. For instance, a self-limiting process may grow the defect-free semiconductor material 113 so that it coalesces with the bottom surface 111 of the third layer 108. As such, process gas stops flowing into the blown-out region 152 and prevents further lateral growth of defect-free semiconductor material 113. Accordingly, a thin second layer 106 may result in a narrow width 144. In one embodiment, the thickness 119 of the second layer 106 is less than 2000 Å. In one particular embodiment, the thickness 119 of the second layer 106 ranges from 200 Å to 2000 Å.

Figure 1H:
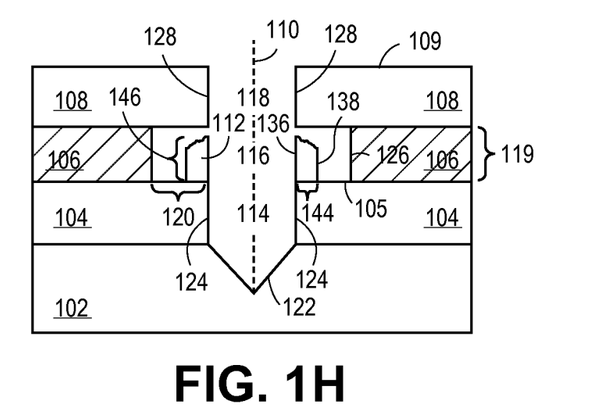

Next, as illustrated in FIG. 1H, the semiconductor material 142 that contains defects 140 is etched away by an anisotropic third etch process. The third etch process uses the third layer 108 as an etching mask. According to an embodiment of the invention, the third layer 108 is a self-aligned mask created by the anisotropic etch process that formed the initial opening 150. The self-aligned third layer 108 has a third opening 118 and a third sidewall 128 that is substantially vertically aligned to the first sidewall 124. As such, the third layer 108 can be used as an etching mask to remove defective semiconductor material 142 within and vertically below the third opening 118. In an alternative embodiment, the third opening 118 is wider than the first opening 114. As such, the first sidewall 124 and the third sidewall 128 are not substantially vertically aligned. Thus, the defective semiconductor material 142 as well as a portion of the defect-free semiconductor material 113 may be removed. Any suitable anisotropic etch process can be used as the third etch process to remove the defective semiconductor material 142. In one embodiment, the third etch process is an anisotropic dry etch process that uses $Cl_2$ plasma to remove defective GaN material.

Because the multi-aspect ratio mask has the self-aligned third layer 108, a separate lithography step is not required to remove the defective semiconductor material 142. Prior art methods disadvantageously require a separate lithography step to etch away the defective portions of the semiconductor structure. Such lithography steps require stringent critical alignments that are highly susceptible to misalignment issues. However, by removing these stringent lithography steps, embodiments of the invention can decrease production cost. In addition, the self-aligned property of the multi-aspect ratio mask can also allow dense integration of semiconductor structures 112 in IC devices due to less constrained registration requirements.

As depicted in FIG. 1H, the defect-free semiconductor structure 112 has an opposing pair of semiconductor sidewalls 136 and 138. More specifically, the semiconductor structure 112 has an inner semiconductor sidewall 136 and an outer semiconductor sidewall 138. The inner semiconductor sidewall 136 is substantially vertically aligned with the first sidewall 124 of the first layer 104. The defect-free semiconductor structure 112 has a width 144 and a height 146. As discussed above, the width 144 and height 146 may be determined based upon a deposition time or a design of the blown-out region 152.

Figure 1I:
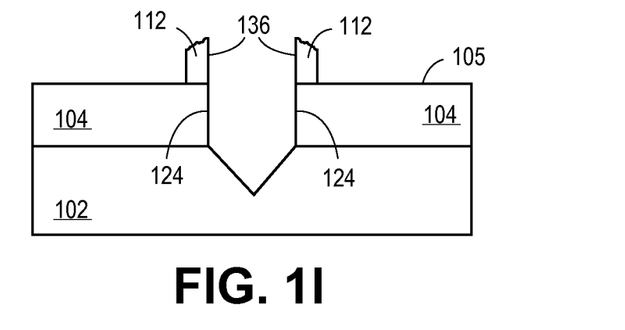
Figure 1I:
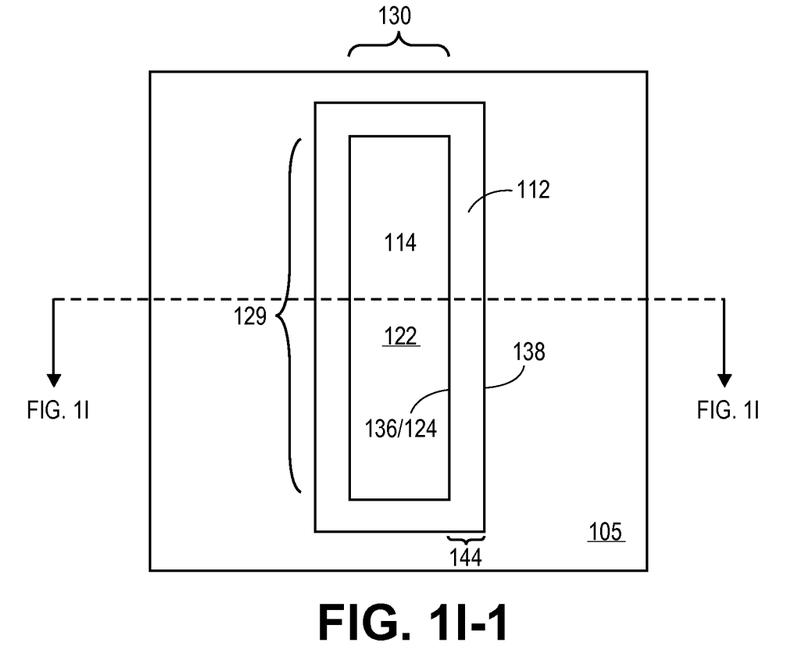
Figure 1I:
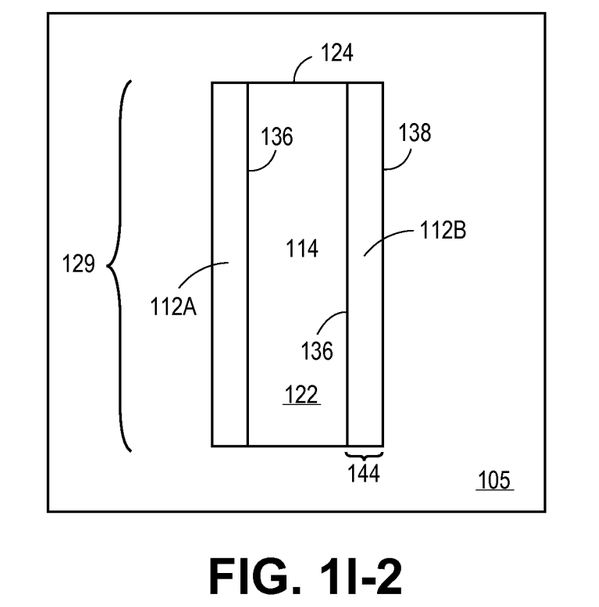

After the defective GaN material is etched out of the mask, the method of forming a semiconductor structure on a dissimilar substrate is now complete. However, various processes may subsequently be performed to form the structures 112 into more practical structures. For example, as depicted in FIG. 1I, a fourth etch process may be used to remove the second and third layers 106 and 108 of the multi-aspect ratio mask. The fourth etch process may be any suitable process typically used in the industry to remove layers of dielectric materials. Only the defect-free semiconductor structures 112 remain on the top surface 105 of the first layer 104 after the fourth etch process. The defect-free semiconductor structure 112 has a width 144 and a height 146. In an embodiment, the inner semiconductor sidewalls 136 of the remaining defect-free semiconductor structures 112 are substantially vertically aligned with the first sidewall 124 of the first layer 104.

Corresponding FIG. 1I-1 depicts a top view perspective of the multi-aspect ratio mask after removing the second and third mask layers 106 and 108. A first opening 114 exposes the top surface 122 of the substrate 102. The defect-free semiconductor structure 112 remains on the top surface 105 of the first layer 104. The inner semiconductor sidewall 136 of the defect-free semiconductor structure 112 is vertically aligned with first sidewall 124 of the first layer 104 located directly below the inner semiconductor sidewall 136. In an embodiment, the defect-free semiconductor structure 112 has a width 144 that proximately forms around the perimeter of the first opening 114. According to an embodiment of the invention, the longer sides of the defect-free semiconductor structure 112 may be used to form active regions for semiconductor devices. In one embodiment, the longer sides of the defect-free semiconductor structure 112 are used to form fins for finFET transistor devices.

Referring to FIG. 1I-2, the illustration depicts a top view perspective of the defect-free semiconductor structure 112 after device cropping. A set of fins 112A and 112B are disposed on the top surface 105 of the first layer 104 according to an embodiment of the present invention. Device cropping may be performed by any suitable masking and etching technique. As depicted in FIG. 1I-2, an embodiment may have resulting fins 112A and 112B with length 129 and width 144. Such fin structures may, for example, operate as fin structures for transistor applications in integrated chip (IC) devices, such as planar transistors and finFET transistors. The inner semiconductor sidewall 136 of fin 112A and 112B are vertically aligned with the first sidewall 124 of the first layer 104. The first opening 114 exposes the top surface 122 of the substrate 102. While the method of forming a semiconductor structure according to an embodiment of the present invention may require a device cropping etch process, the critical dimension requirements in photolithography for device cropping are significantly less stringent than the requirements in photolithography for forming a mask to remove defective material within a narrow opening. Therefore, replacing the more stringent photolithography process with a less stringent photolithography process is advantageous for not only economic reasons such as decreasing cost, but also production reasons such as increasing throughput and decreasing turnaround time.

Figure 1J:
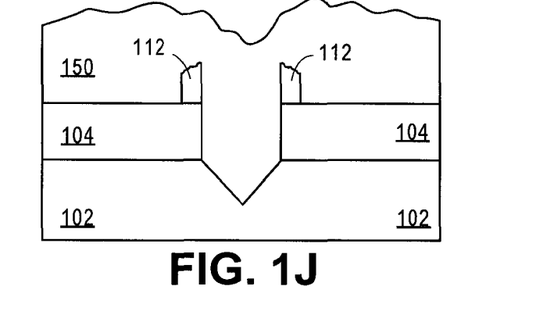

Referring to FIG. 1J, a shallow trench isolation (STI) material 150 is blanket deposited over the exposed surfaces of the first layer 104, substrate 102, and defect-free semiconductor structures 112 after device cropping. STI 150 may be any suitable insulating layer such as silicon dioxide. The STI layer 150 may be deposited by chemical vapor deposition (CVD), plasma vapor deposition (PVD), plasma enhanced chemical vapor deposition (PECVD), atomic layer deposition (ALD), or any other suitable technique used to form a blanket deposition of low-k dielectric materials on substrates with trenches. In one embodiment, the method of depositing the STI material 150 is by CVD.

Figure 1K:
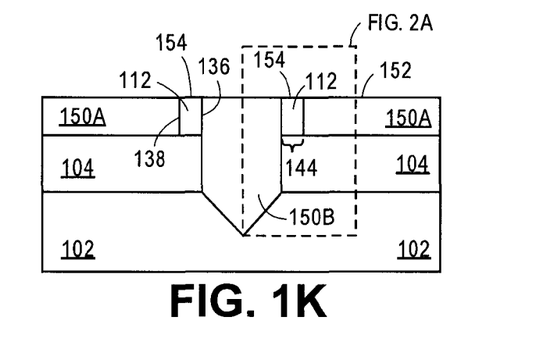

As illustrated in FIG. 1K, after deposition of the STI 150, the STI 150 may be planarized to the top surface 154 of the defect-free semiconductor structure 112 by any suitable planaraization process such as CMP. The defect-free semiconductor structure 112 has a flat top surface 154 following the planarization process. The defect-free semiconductor structure 112 has a width 144 formed by LEO of defect-free semiconductor material 113. In an embodiment, the dimensions of the blown-out region 152 determine the width 144 of the defect-free semiconductor structure 112. In some embodiments, planarization of the STI 150 results in forming two portions of STI structures: STI 150A and STI 150B. Top surfaces 152 of STI 150A and 150B are substantially coplanar with the top surface 154 of the defect-free semiconductor structure 112. STI 150B is disposed on top of the substrate 102 and directly adjacent to the first sidewall 124 of the first layer 104 and the inner semiconductor sidewall 136 of the defect-free semiconductor structure 112. In addition, STI 150A is disposed on the top surface 105 of the first layer 104 and directly adjacent to the outer semiconductor sidewall 138 of the defect-free semiconductor structure 112. As a result, defect-free semiconductor structures 112 have an exposed top surface 154 for forming devices, such as a planar MOSFET transistor.

Figure 2A:
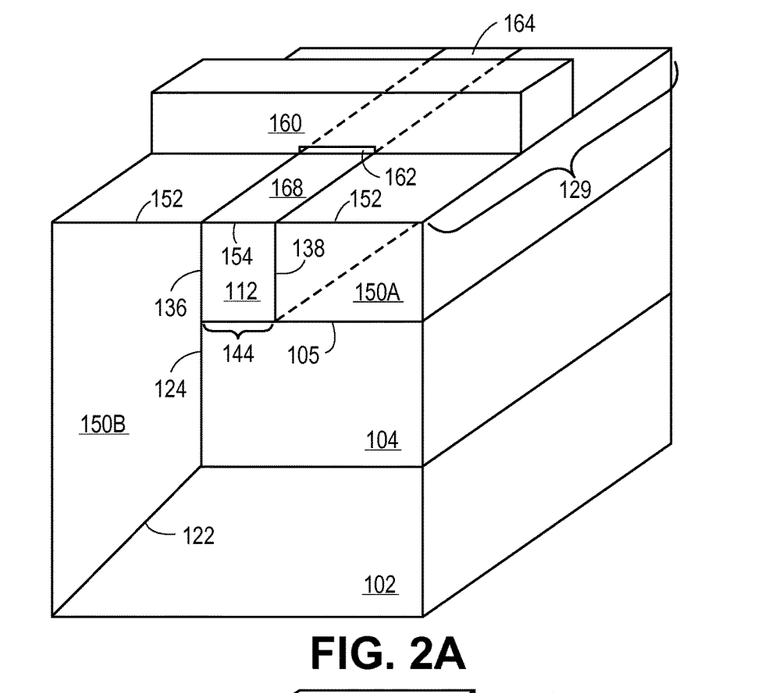
FIG. 2A illustrates an isometric view of a planar device having a semiconductor source, drain, and channel region formed on a dissimilar substrate, in accordance with an embodiment of the invention.

FIG. 2A illustrates an isometric view of a planar MOSFET device formed on a defect-free semiconductor structure 112 in accordance with an embodiment of the invention. The dotted rectangular frame depicted in FIG. 1K shows the cross-sectional viewing plane of FIG. 2A.

Illustrated in FIG. 2A, the planar MOSFET device is formed by a gate electrode 160 disposed over a portion of a top surface 154 of a defect-free semiconductor structure 112. The defect-free semiconductor structure 112 has a width 144. In an embodiment, a width 144 of the defect-free semiconductor structure 112 is chosen to provide a desired gate width for forming a planar MOSFET transistor. Furthermore, the defect-free semiconductor structure 112 extends a distance 129 of the MOSFET device. The gate electrode 160 may be composed of any suitable material and formed by any suitable technique typically used in the art. Disposed directly between the defect-free semiconductor structure 112 and the gate electrode 160 is a gate dielectric 162. The gate dielectric 162 may be an oxide material, such as silicon dioxide, formed by any technique well known in the art. In addition, a channel region is formed by a portion of the defect-free semiconductor structure 112 disposed below the gate electrode 160 and directly below the gate dielectric 162. A source region 168 and a drain region 164 are formed by a portion of the defect-free semiconductor structure 112 disposed directly adjacent and on opposite sides of the channel region.

Furthermore, the planar MOSFET device includes a first dielectric 104 and a second dielectric 150. The first dielectric 104 is disposed directly below the defect-free semiconductor structure 112. The first dielectric 104 electrically insulates a bottom surface 149 of the defect-free semiconductor structure 112. The second dielectric 150 includes two portions: a first portion 150A and a second portion 150B. The first portion 150A is disposed directly on the top surface 105 of the first dielectric layer 104 and immediately adjacent to the outer semiconductor sidewall 138 of the defect-free semiconductor structure 112. The second portion 150B is disposed directly on the top surface 122 of the semiconductor substrate 102 and immediately adjacent to the inner semiconductor sidewall 136 of the defect-free semiconductor structure 112 and the first sidewall 124 of the first layer 104. The second dielectric 150 electrically insulates the opposing semiconductor sidewalls 136 and 138 of the defect-free semiconductor structure 112. In one embodiment, the inner semiconductor sidewall 136 and first sidewall 124 are substantially vertically aligned to one another. The self-aligned properties of the third layer mask 108 causes the inner semiconductor sidewall 136 and the first sidewall 124 to be substantially vertically aligned to one another. In addition, in one embodiment, the top surface 152 of the STI 150 is substantially coplanar with the top surface 154 of the defect-free semiconductor structure 112.

Figure 1L:
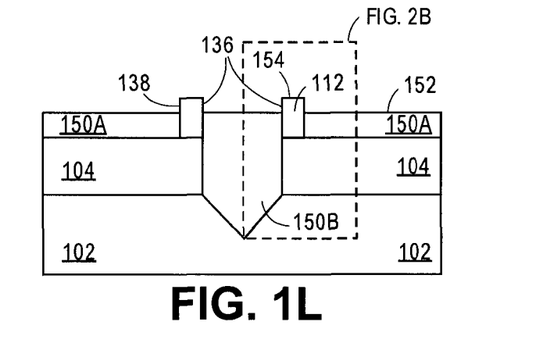

Referring to an alternative embodiment depicted in FIG. 1L, after planarizing STI 150, a separate etch process, such as an HF wet etch process, further removes the STI 150 in order to form a non-planar device (e.g., a tri-gate or finFET transistor). After the separate etch process, the top surface 152 of the STI 150 is below the top surface 154 of the defect-free semiconductor structure 112 and above the top surface 105 of the first dielectric layer 104. As such, the top surface 154 and a portion of the inner and outer semiconductor sidewalls 136 and 138 of the defect free semiconductor structure 112 are exposed. STI 150B is disposed on top of the substrate 102 and directly adjacent to the first sidewall 124. In one embodiment, STI 150B is further adjacent to only a portion of the inner semiconductor sidewall 136 of the defect-free semiconductor structure 112. STI 150A forms on top of the first dielectric layer 104 and directly adjacent to only a portion of the inner semiconductor sidewall 136 of the defect-free semiconductor structure 112. The exposed top surface 154 and inner and outer semiconductor sidewalls 136 and 138 may thus form a fin structure for forming a finFET transistor.

As is known, a finFET is a transistor built around a thin strip of semiconductor material generally referred to as the fin. The transistor includes the standard field effect transistor (FET) nodes, including a gate, a gate dielectric, a source region, and a drain region. The conductive channel of the device resides on the outer sides of the fin beneath the gate dielectric. Specifically, current runs along both sides of the fin (sides perpendicular to the substrate surface) as well as along the top of the fin (side parallel to the substrate surface). Because the conductive channel of such configurations essentially resides along the three different outer, planar regions of the fin, such a finFET design is sometimes referred to as a tri-gate finFET.

Figure 2B:
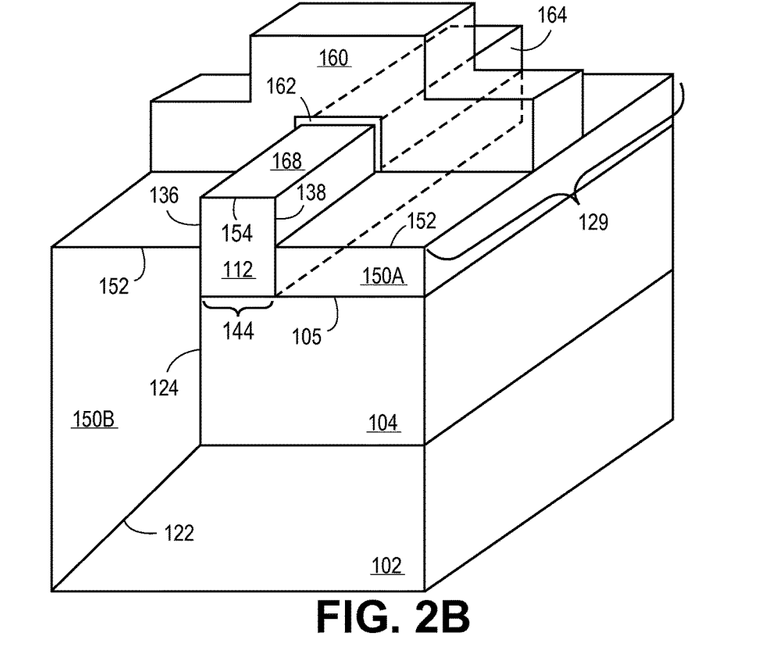
FIG. 2B illustrates an isometric view of a finFET device having a fin formed by a semiconductor material disposed on a dissimilar substrate, in accordance with an embodiment of the invention.

FIG. 2B illustrates an isometric view of such a finFET transistor formed on a defect-free semiconductor structure 112 in accordance with an embodiment of the invention. The dotted rectangular frame depicted in FIG. 1L shows the cross-sectional viewing plane of FIG. 2B.

As illustrated in FIG. 2B, the non-planar finFET device is formed by a gate electrode 160 wrapped around a portion of three exposed surfaces of a defect-free semiconductor structure 112. The defect-free semiconductor structure 112 is a fin that has a width 144. In an embodiment, a width 144 of the fin 112 is chosen to provide a desired gate width for forming a finFET transistor. Furthermore, the defect-free semiconductor structure 112 extends a distance 129 of the finFET device. Disposed directly between the fin 112 and the gate electrode 160 is a gate dielectric 162. The gate dielectric 162 contacts the top surface 154 and a portion of the inner and outer sidewalls 136 and 138 of the fin 112. In addition, a channel region is formed by a portion of the fin 112 disposed directly below and adjacent to the dielectric layer 162. A source region 168 and a drain region 164 are formed by a portion of the fin 112 disposed directly adjacent and on opposite sides of the channel region. In an embodiment, a width 144 of the defect-free semiconductor structure 112 is chosen to provide a desired gate width for forming a finFET transistor.

The non-planar finFET device further includes a first dielectric 104 disposed directly below the fin 112. A second dielectric 150 includes two portions: a first portion 150A and a second portion 150B. The first portion 150A is disposed directly on the top surface 105 of the first dielectric layer 104 and immediately adjacent to a portion of the outer semiconductor sidewall 138 of the fin 112. The second portion 150B is disposed directly on the top surface 122 of the semiconductor substrate 102 and immediately adjacent to the first sidewall 124 of the first layer 104 and a portion of the inner semiconductor sidewall 136 of the fin 112. In one embodiment, the inner semiconductor sidewall 136 and first sidewall 124 are substantially vertically aligned to one another. The self-aligned properties of the third layer mask 108 causes the inner semiconductor sidewall 136 and the first sidewall 124 to be substantially vertically aligned to one another. In an embodiment, the top surface 152 of the second dielectric 150 is below the top surface of the fin 112 and above the top surface 105 of the first dielectric 104.

Figure 3:
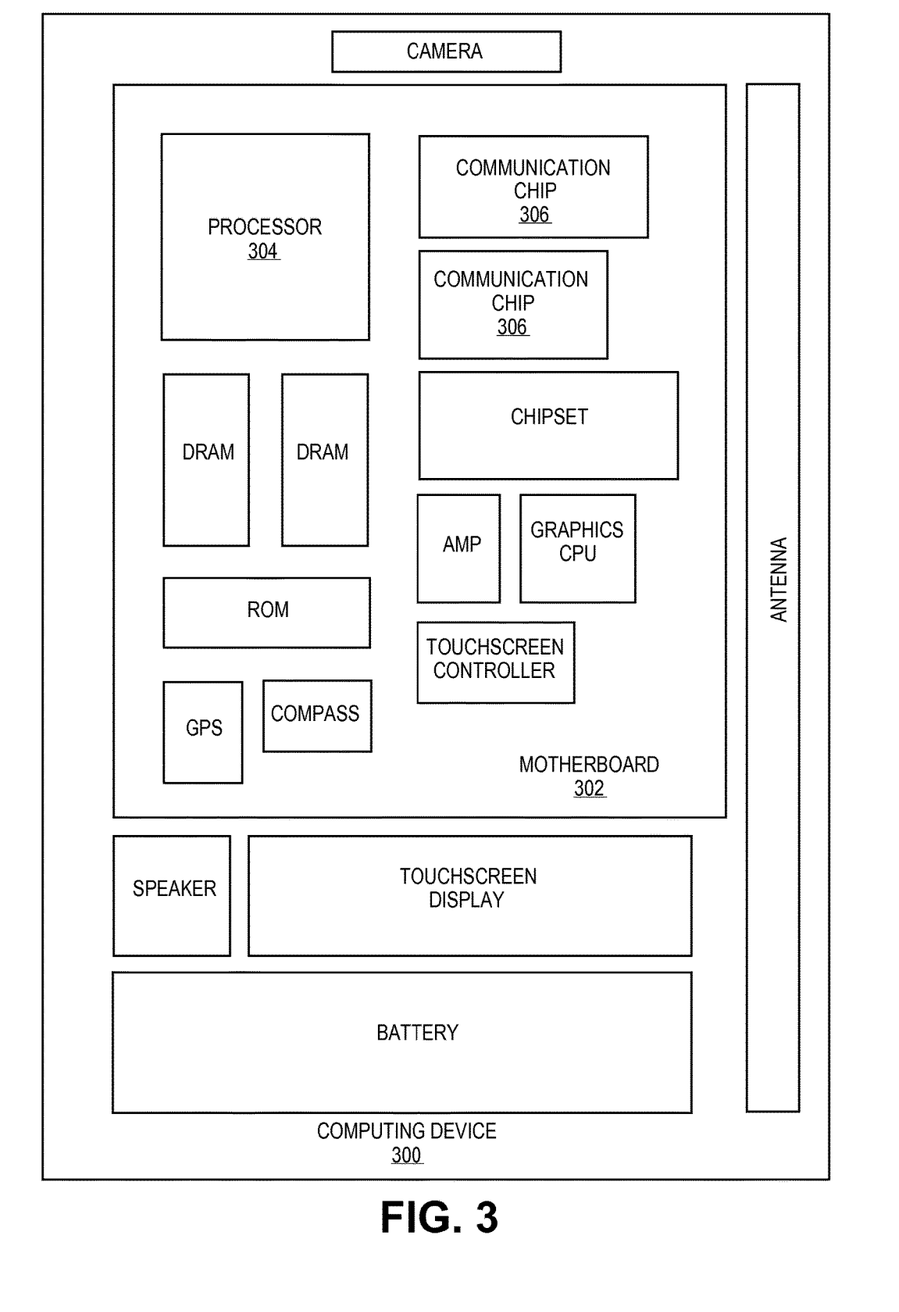
FIG. 3 illustrates a computing system implemented with one implementation of the invention.

FIG. 3 illustrates a computing system 300 implemented with one implementation of the invention. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the invention, the integrated circuit die of the processor includes one or more devices, such as airgap interconnects with hood layers, that are formed in accordance with implementations of the invention. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the invention, the integrated circuit die of the communication chip includes one or more devices, such as transistors formed from a semiconductor structure on a dissimilar substrate, that are formed in accordance with implementations of the invention.

In further implementations, another component housed within the computing device 300 may contain an integrated circuit die that includes one or more devices, such as airgap interconnects with hood layers, that are formed in accordance with implementations of the invention.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

In an embodiment, a method of forming a semiconductor structure comprises forming a mask comprising a first, a second, and a third layer on a substrate; the first layer having a first opening with a first width and a first sidewall exposing a top surface of the substrate; the second layer having a second opening with a second width and a second sidewall exposing the top surface of the substrate and a top surface of the first layer, the second width is greater than the first width; and the third layer having a third opening with a third width and a third sidewall exposing the top surface of the substrate, wherein the first, second, and third openings are centered along a common central axis; growing a semiconductor material from the top surface of the substrate and laterally onto the top surface of the first layer; and etching the semiconductor material disposed within and vertically below the third opening by using the third layer as an etching mask so that the semiconductor material that laterally overflowed onto the top surface of the first layer forms a remaining structure. In an alternative embodiment, the forming a mask comprising a first, a second, and a third layer on a substrate further comprises depositing the first, second, and third layers on the substrate, the second layer formed above the first layer and below the third layer; forming an initial opening through the first, second, and third layers; and etching the second layer from within the initial opening with an etch process selective to the first and third layers. In another embodiment, the method of forming a semiconductor structure further comprises removing the second and third layers; blanket depositing a dielectric material on the top surface of the substrate, the top surface of the first layer, the first sidewall, and exposed surfaces of the remaining structure; and planarizing the dielectric material to a top surface of the remaining structure. In yet another embodiment, the method of forming a semiconductor structure further comprises removing a portion of the dielectric material to expose a top surface of the remaining structure and a portion of two opposing sidewalls of the remaining structure.

In an alternative embodiment, the planarizing forms a flat top surface on the remaining structure. In another embodiment, the semiconductor material comprises at least one element of a group consisting of III-V semiconductor material, gallium, nitride, germanium, and silicon. In yet another embodiment, the semiconductor material comprises GaN. In one embodiment, the semiconductor material comprises SiGe. In one other embodiment, the substrate comprises silicon. In another embodiment, the first, second, and third layers are metal layers. In yet another embodiment, the first, second, and third layers are dielectric layers. In one embodiment, the second layer comprises a material different from a material of the first and third layers. In an alternative embodiment, the second layer can be selectively etched relative to the first and third layers. In another embodiment, the second layer comprises silicon nitride and the first and third layers comprise silicon dioxide. In yet another embodiment, the etching the semiconductor material is an anisotropic etch process. In an embodiment, the third width is equal to the first width. In an alternative embodiment, the third width is greater than the first width. In another embodiment, the top surface of the substrate is a modified surface. In yet another embodiment, the modified surface comprises a V-groove profile. In one other embodiment, the V-groove profile exposes the <111> plane in the substrate.

In an embodiment, a semiconductor structure comprises a first layer disposed on a substrate, the first layer having an opening with a first sidewall exposing a top surface of the substrate; a semiconductor structure disposed on a top surface of the first layer, the semiconductor structure having an opposing pair of inner and outer semiconductor sidewalls, wherein the inner semiconductor sidewall and first sidewall are vertically aligned to one another; and a second layer disposed adjacent to the inner semiconductor sidewall, adjacent to the dielectric sidewall, and on the top surface of the substrate. In another embodiment, the second layer is further disposed adjacent to the outer semiconductor sidewall and on the first layer. In one embodiment, a top surface of the second layer and a top surface of the semiconductor structure are coplanar. In one other embodiment, the second layer is lower than a top surface of the semiconductor structure and above a top surface of the first layer. In another embodiment, the semiconductor structure has an exposed top surface and an exposed portion of the inner and outer semiconductor sidewall. In yet another embodiment, the semiconductor structure comprises a material selected from at least one element of a group consisting of III-V semiconductor material, gallium, nitride, germanium, and silicon. In an embodiment, the semiconductor structure comprises GaN. In an alternative embodiment, the semiconductor structure comprises SiGe. In another embodiment, the substrate comprises silicon. In yet another embodiment, the top surface of the substrate is a modified surface.

In utilizing the various aspects of this invention, it would become apparent to one skilled in the art that combinations or variations of the above embodiments are possible for forming a transistor formed from a semiconductor structure on a dissimilar substrate. Although embodiments of the present invention have been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating embodiments of the present invention.

What is claimed is:

1. A method of forming a semiconductor structure, comprising:
    forming a mask comprising a first, a second, and a third layer on a substrate;
        the first layer having a first opening with a first width and a first sidewall exposing a top surface of the substrate;
        the second layer having a second opening with a second width and a second sidewall exposing the top surface of the substrate and a top surface of the first layer, the second width is greater than the first width; and
        the third layer having a third opening with a third width and a third sidewall exposing the top surface of the substrate, wherein the first, second, and third openings are centered along a common central axis;
    growing a semiconductor material from the top surface of the substrate and laterally onto the top surface of the first layer; and
    etching the semiconductor material disposed within and vertically below the third opening by using the third layer as an etching mask so that the semiconductor material that laterally overflowed onto the top surface of the first layer forms a remaining structure.

2. The method of claim 1, wherein the forming a mask comprising a first, a second, and a third layer on a substrate comprises:
    depositing the first, second, and third layers on the substrate, the second layer formed above the first layer and below the third layer;
    forming an initial opening through the first, second, and third layers; and
    etching the second layer from within the initial opening with an etch process selective to the first and third layers.

3. The method of claim 1, further comprising:
    removing the second and third layers;
    blanket depositing a dielectric material on the top surface of the substrate, the top surface of the first layer, the first sidewall, and exposed surfaces of the remaining structure; and
    planarizing the dielectric material to a top surface of the remaining structure.

4. The method of claim 3, further comprising removing a portion of the dielectric material to expose a top surface of the remaining structure and a portion of two opposing sidewalls of the remaining structure.

5. The method of claim 3, wherein the planarizing forms a flat top surface on the remaining structure.

6. The method of claim 1, wherein the semiconductor material comprises at least one element of a group consisting of III-V semiconductor material, gallium, nitride, germanium, and silicon.

7. The method of claim 6, wherein the semiconductor material comprises GaN.

8. The method of claim 6, wherein the semiconductor material comprises SiGe.

9. The method of claim 1, wherein the substrate comprises silicon.

10. The method of claim 1, wherein the first, second, and third layers are metal layers.

11. The method of claim 1, wherein the first, second, and third layers are dielectric layers.

12. The method of claim 11, wherein the second layer comprises a material different from a material of the first and third layers.

13. The method of claim 12, wherein the second layer can be selectively etched relative to the first and third layers.

14. The method of claim 13, wherein the second layer comprises silicon nitride and the first and third layers comprise silicon dioxide.

15. The method of claim 1, wherein the etching the semiconductor material is an anisotropic etch process.

16. The method of claim 1, wherein the third width is equal to the first width.

17. The method of claim 1, wherein the third width is greater than the first width.

* * * * *